Figure 1:
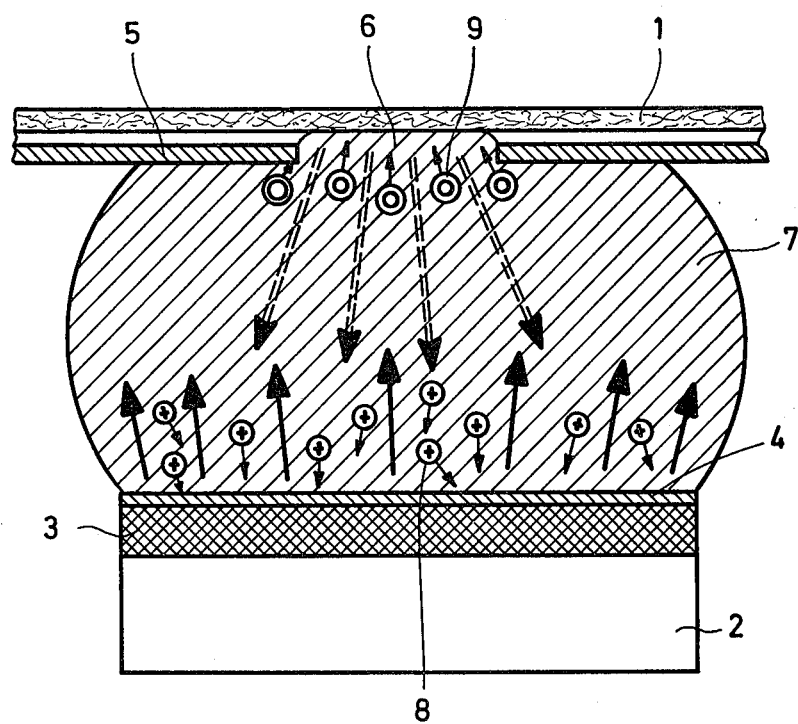

United States Patent [19]

Heimbach et al.

[11] 4,428,809

[45] Jan. 31, 1984

[54] METHOD AND APPARATUS FOR FORMING ELECTRICALLY CONDUCTIVE TRANSPARENT OXIDE

[75] Inventors: Klaus J. Heimbach, Hattersheim; Wolf-Dieter Münz, Somborn; Rolf Adam, Hanau am Main; Heinz Wenzl, Abstadt, all of Fed. Rep. of Germany

[73] Assignee: Leybold Heraeus GmbH, Cologne, Fed. Rep. of Germany

[21] Appl. No.: 362,432

[22] Filed: Mar. 26, 1982

[30] Foreign Application Priority Data

Mar. 27, 1981 [DE] Fed. Rep. of Germany ....... 3112104

[51] Int. Cl.³ ............................................. C23C 15/00
[52] U.S. Cl. ............................ 204/192 P; 204/192 R; 204/298
[58] Field of Search ............... 204/192 R, 192 P, 298, 204/192

[56] References Cited

U.S. PATENT DOCUMENTS 3,884,787  5/1978  Kuehnle .......................... 204/192 P
4,113,599  9/1978  Gillery ............................ 204/192 P Primary Examiner—Arthur P. Demers
Attorney, Agent, or Firm—Felfe & Lynch

[57] ABSTRACT

The invention concerns a method of and apparatus for forming electrically conductive transparent oxide coatings on water-containing substrates by magnetic-field reinforced cathodic atomization of a target hot-pressed from powdered oxide ceramic materials. The coatings formed have electrical conductivity.

When the atomization process is carried out using direct-current voltages of between 150 and 600 volts and a power density of 3 to 15 and preferably 5 to 10 watts/cm², the degree of pressing of the target is at least 75% of the density of the solid material and the atomization atmosphere is maintained at between $1 \times 10^{-3}$ and $5 \times 10^{-2}$ mbars with a composition of 2 to 20% oxygen, 40 to 70% hydrogen, and the remainder argon. Based upon the speed of travel of the web, a thickness of coating of between 10 and 100 mm and a specific resistance of between 100 and 10,000 $\mu\Omega$cm are achieved.

5 Claims, 3 Drawing Figures

METHOD AND APPARATUS FOR FORMING ELECTRICALLY CONDUCTIVE TRANSPARENT OXIDE

The invention concerns a method of producing electrically conductive transparent coatings on water-containing substrates, especially in web form such as paper, foils, etc., by magnetic-field reinforced cathodic atomization of oxide ceramic targets hot-pressed from powered material selected from the group consisting of powders comprised in the group indium oxide/tin-oxide mixtures, cadmium oxide/tin oxide mistures and tin oxide.

In the majority of cases oxide ceramic targets are non-conductors as are the coatings formed from these targets and deposited on substrates by means of a cathodic atomization process. In these cases, the coatings are referred to as "dielectric coatings". In practice, atomization of dielectric oxide ceramic coatings has hitherto been carried out only by using high frequency, whereby the materials, which become insulators, can be readily atomized and deposited at great rates. Hitherto, by the application of direct-current voltage to the atomizing cathode, it has not been possible to obtain an atomization rate of any great magnitude on a regular basis.

In a few specific applications it has been found necessary to form transparent oxide coatings which are electrically conductive without containing metallic inclusions. Examples of this are what are called "anti-static coatings" on plastics materials, which are intended to eliminate surface charges and what are called LCD installations (display systems using liquid crystals), wherein the electrodes for aligning the crystal molecules should, as far as possible, not be visible. Finally, there exists a need for high-grade papers such as banknotes that cannot be forged; the appearance of such papers is required to remain unchanged and it is required to be able to check that they are genuine by means of electrical scanning involving determination of conductivity.

A method of producing high-grade papers which cannot be forged and which have an electrically conductive surface coating, as well as the paper itself are described in DE-AS No. 28 45 401 (claim 12). It is also stated in that specification that the coating concerned is to consist of tin oxide (claim 13). However, it has transpired that the production of such coatings on an industrial scale and having reproducible properties is extremely difficult to achieve. In this connection, an important role is obviously played by the fact that a plurality of method parameters have to be observed; to some extent these run counter to each other and can be controlled only with difficulty, and there is considerable dependence upon the condition of the substrate material. As regards this, particular mention might be made of the moisture that is unavoidably present in paper.

The object of the present invention is therefore to provide a method of the initially described kind whereby substrates of large area can be provided with electrically conductive transparent oxide layers on a reproducible and economical basis, i.e. over a lengthy period of operation of the necessary equipment. Of decisive importance as regards the economics of the system is a high deposition rate accompanied by the greatest possible speed of travel of the substrate that is to coated, when this substrate is in web form.

According to the invention, this object is achieved by the use of the following steps:

(a) The atomizing process is carried out with direct-current voltages of between 150 and 160 volts, (b) the power density is adjusted to 1 to 15, preferably 5 to 10 watt/cm$^2$ of the target surface, (c) the degree of pressing of powdered target material is so selected that the target acquires at least 75% of the density of the solid material, (d) the atomization atmosphere is held at between $1 \times 10^{-3}$ and $5 \times 10^{-2}$ mbars, and is brought, by the controlled introduction of argon, hydrogen and oxygen, to a composition which comprises 2 to 20% of oxygen, 40 to 70% of hydrogen and the rest argon (all values: percent by volume), and (e) the speed of travel of the web is so adjusted that a thickness of coating of between 10 and 100 nanometers is achieved and the specific resistance is between 100 and 10,000 $\mu\Omega$ cm.

Of particular importance in this connection is, firstly, the use of what is called a magnetic-field reinforced cathodic atomization. Cathode arrangements in which the atomization rate is raised by concentration of the glow discharge by means of a closed magnetic field at the target surface belong to the prior art (DE-OS No. 22 43 708). With such arrangements it is possible to increase the atomization rate by a factor of 10 and at the same time to reduce the atomization pressure by a factor of 5, so that high-purity coatings can be produced. The term "high-duty atomization" is now used for designating processes carried out in this way. However, for atomizing dielectric targets, these known arrangements use high frequency. Apart from the need for providing a high-frequency generator for the purpose, considerable problems arise in impedance matching and in the running of wires and in particular with regard to the considerable electrical losses caused by the high-frequency coupling. Experts in the technique have therefore accepted the need for high-frequency coupling only because this has rendered it possible to atomize the dielectric target materials in an effective manner. Hitherto conductive materials, such as the initially mentioned tin oxide or mixtures thereof with indium oxide and cadmium oxide, have been atomized by means of high frequency, since, unless special steps are taken, it is not possible to atomize these materials in a reliable manner by means of direct-current voltage.

Surprisingly, it has now been found that such materials that are regarded as semi-conductors are also effective, i.e. they can be used at atomization rates of up to 10 nm/sec and by the application of direct-current voltage to obtain great uniformity in, i.e. reproducibility of, the process.

One of the steps involved is the use of a relatively high power density of 3 to 15 watts per cm$^2$ of target surface, and preferably 5 to 10 watts/cm$^2$. These ranges are to be considered in the context of a prior art in which the upper limits of power density for dielectric materials is approximately 3 watts/cm$^2$ and in which avoidance of magnetic-field reinforcement and the use of high frequency are prerequisites. Even in the case of what is called high-duty atomization it has been possible, as regards a few selected compounds, to increase the power density to a maximum of 8 watts/cm$^2$ while using high frequency. In the majority of cases, the target material has been immediately destroyed when a power limit of approximately 3 watts/cm$^2$ is exceeded. When using high-duty atomization, i.e. with a magnetic-field reinforcement, success has been achieved in raising the power density to a maximum of 15 watts/cm² only in the case of metallic materials, since such substrates obviously have a greater resistance to heat and, furthermore, the cooling problems can be controlled considerably more efficiently.

In the case of the subject-matter of the present invention, the high power density should be considered mainly in connection with the release of water vapour from the substrate. Because of a high power density, partial reduction of the oxides takes place, accompanied by reciprocal action with the hydrogen content, to be described later, in the atomization atmosphere at the target surface, so that a certain excess of metal occurs in the material flowing to the substrate, which excess getters the released water vapour on the substrate surface or on components of the equipment.

A further important aspect is what is called the "degree of pressing", which term will be understood as meaning the ratio of the density, achieved during the pressing operation on the targets, to the (theoretical) density of the solid, i.e. pore-free material. Whereas in the case of the previously used targets having the initially stated composition, degrees of pressing of between approximately 50 and 70% were reached so as not to endanger the economics of the method, according to the invention, the degree of pressing is advantageously increased to at least 80% of the density of the solid material. Whereas, with the previously employed degrees of pressing and the experimental use of direct-current voltage, the atomization process gradually faded out, by maintaining a degree of pressing as proposed in the invention, it was surprisingly found that the atomization process can be maintained over practically any required period of time, despite the use of direct-current voltage. Investigations have shown that, with the known low degrees of pressing and the considerable porosity of the targets, migration of oxygen into the target material obviously takes place, and this leads to mutual electrical insulation of the oxide particles at the grain boundaries. In contrast to this, it has been surprisingly found that, when the limit of 75% proposed by the invention for the degree of pressing is exceeded, this increasing insulation effect quite clearly ceases within the target.

As stated above, the maintenance of the composition of a specific atomization atmosphere is of very considerable importance. It has been stated that, because of the presence of hydrogen on the target surface, partial reduction occurs in the direction of the metallic components of the target, so that with gettering of water vapour, this metal, among other materials, is deposited on the substrate. If additional measures were not taken, this would of course lead to the formation of a metallic or dark-coloured coating. To prevent this and again with the final properties of the product of the method in mind, the atomization atmosphere, in accordance with the invention, contains a considerable proportion of oxygen which lies between 2 and 20% and preferably between 4 and 10%. The effect of oxygen can be very readily observed. In the case of oxygen impoverishment, metallic or dark-coloured coatings are obtained. If the oxygen content in the atomization atmosphere is gradually increased, it is possible to observe that the coating produced becomes transparent and therefore invisible almost spontaneously. A method of determining the optimum oxygen concentration is given in the detailed description. On account of the required relatively high conductivity of the coating, preference is given to an oxygen concentration which, while meeting the requirements regarding transparency, is close to the minimum value of the surface resistance when the latter is plotted against a (variable) oxygen content.

It has also been stated that the hydrogen concentration in the atomization atmosphere has considerable influence on the product provided by the method. The hydrogen range of 40 to 70 percent by volume, as proposed by the invention, can be regarded as above the average as compared with the prior art. In this connection it has been found that for optimizing the method, the greater the proportion of water contained in the substrate material and participating in the process, the greater must be the proportion of hydrogen. This proportion of water increases with the water content, i.e. with the thickness of the substrate material, but also, in a perceptible manner, with the speed of travel of the web, which speed determines the quantity of water that is supplied per unit of time. Surprisingly, the greater the quantity of water supplied per unit of time, i.e. the greater the speed of travel of the web, the greater must be the hydrogen content of the atomization atmosphere. It can be assumed that the hydrogen, together with the above-described getter effect, prevents or at least suppresses the escape of water vapour from the substrate material. A procedure for optimizing the hydrogen content in the atomization atmosphere in dependence upon the speed of travel of the web is dealt with in the detailed description. It is generally found that the hydrogen proportion quite obviously influences the effect of the glow discharge in the atomization process, and this normally results in increased release of water vapour.

It will be understood that the substrate material is previously dried, though, for practical reasons, complete freedom from water cannot be achieved without damage to the substrate material, so that this material has to be used in the coating process while containing a quite considerable quantity of residual water amounting to several percent by weight.

The object aimed at is fully achieved by the method of the invention, i.e. water-containing substrate material is coated with oxide semi-conducting target material by the use of direct-current voltage, and the process can be operated continuously and without a noticeable change in the properties of the coating until the roll of web material, fitted in the apparatus for carrying out the process, has been completely coated. In this connection it should be taken into account that, depending upon the thickness of the substrate material, rolls having a length of material of between 3000 and 6000 m can be coated. Whereas rolls of paper comprise a length of material of 3000 m, rolls of plastics foil may easily comprise a length of material of 6000 m or more. The coating of such a length of substrate in one pass can easily be achieved by means of the method in accordance with the invention.

The composition of the target may vary within certain limits. In the case of an indium oxide/tin oxide target, the tin oxide content may vary between 5 and 20 mole percent; this content is preferably 10 mole percent (see Example described hereinafter) and the remainder is indium oxide. In the case of a target consisting of a cadmium oxide/tin oxide mixture, the tin oxide content may be between 10 and 40 mole percent; it is preferably 30 mole percent and the remainder is cadmium oxide.

The invention also relates to apparatus for performing the method, which apparatus consists of a vacuum chamber with means for moving the substrate to be coated through a coating zone, and of a high-duty cathode arrangement with a target which is spaced from and is substantially parallel with the substrate, the coating zone being defined, on the one hand by the substrate and, on the other, by the target.

In a further feature of the invention, such apparatus is characterized in that a plate-like screen is arranged immediately in front of the substrate, which screen has an opening which is appreciably smaller than the extent of the coating zone in directions parallel with the target surface.

It is known to place screens in front of the substrate surface. They generally serve to limit the flow of coating material so as to produce specific surface patterns on the substrate. If such screens are arranged in strip form in front of the web-like substrate and parallel with the direction of travel of the web, they serve to produce stripe patterns, for example, in the production of condenser foils. However, such screens are substantially ineffective as regards the production of patterns in the direction of travel of the web, since the latter moves continuously over the screen which is usually of gapped construction. Therefore, in the direction of travel of the web, such screens are not made smaller than the extent of the coating zone so as to enable the greatest possible proportion of the target material to be deposited on the substrate.

However, according to the invention, the screen is intentionally designed to be appreciably smaller than the extent of the coating zone, particularly in the direction of travel of the web, so that a considerable part of the target material condenses on the plate-like screen. It can be assumed that a considerable portion of the target material is caused to condense on the screen and, as a result of the above-described getter mechanism, a considerable part of the undesirable gases and vapours is gettered on the screen.

Further advantageous forms of the subject-matter of the invention, especially the steps necessary for optimizing performance of the method of the invention, are the subject-matter of the remaining subsidiary claims.

An example showing how the method is carried out and apparatus used for the purpose will now be described in greater detail by reference to the drawings, and a test example will be described.

Figure 2:
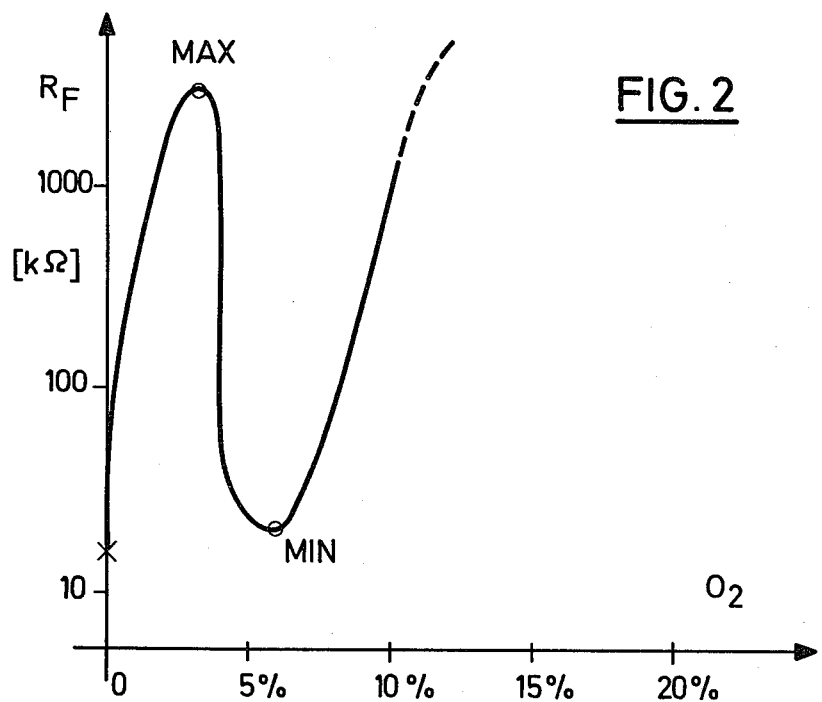
Figure 3:
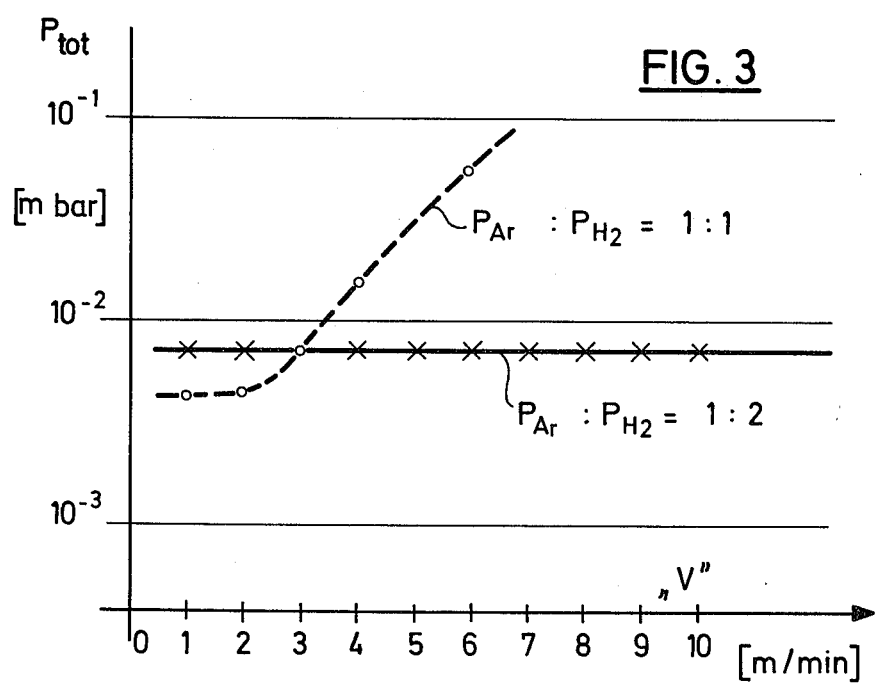

In the drawings:

FIG. 1 shows a cross-section through the coating zone of an apparatus and the operating mechanism, FIG. 2 illustrates, in the form of a graph, the relationship between the surface resistance $R_F$ and the oxygen content of the atomization atmosphere, and FIG. 3 illustrates the parameters concerned in the relationship between total pressure $P_{tot}$ in the system and the speed of travel of the web for different compositions of the atomizing atmosphere—$P_{Ar}:P_{H2}$. The dimensions and units can be seen from the graphs.

FIG. 1 illustrates only the details and processes in the coating zone itself, i.e. the vacuum chamber and its functional parts including a roll-over mechanism for the web-like substrate are omitted, since these details form part of the prior art.

The Figure illustrates a substrate 1 in the form of a paper web which is arranged opposite a high-duty cathode 2 which is simply shown diagrammatically in contour. Secured to the cathode 2 is a target 3, which is made of the above-specified oxide or oxide mixture. This target has a target surface 4 which extends parallel with the substrate 1, the term "parallel" also being understood as including a curved form of the target surface when, for example, the substrate is fed over a cylindrical roll. The only important feature is that a gap is formed between the target surface 4 and the substrate 1.

Arranged in the high-duty cathode 2 is a magnet system, not illustrated, which produces magnetic field lines which emerge from the target surface towards the substrate and, after having moved along an arcuate path, re-enter this surface and thus form, over the target surface, a closed magnetic field in which the glow discharge is concentrated in the immediate zone of the target surface.

A plate-like screen 5 having an opening 6 is disposed immediately in front of the substrate 1. The current connections and earth connections are not shown.

When the individually described conditions are maintained, a glow discharge is created between the target surface 4 and the substrate 1 or the screen 5, this discharge being indicated by the hatched zone 7. This zone 7 also substantially illustrates the coating zone.

Ionized oxygen atoms 8 move towards the target surface under the effect of the glow discharge, whereas neutral oxygen atoms 9 travel towards the substrate 1 and the screen 5. The target surface 4 is partially reduced over a slight depth by the effect of hydrogen, so that a stream of material having a metal excess emerges from the target surface towards the substrate 1 and the screen 5 in the direction indicated by the solid-line arrows, which excess exercises the above-described getter action. This stream of material might be opposed by a stream of water vapour in the direction indicated by the broken-line arrows, which stream of water vapour might be released from the substrate 1 under the influence of the glow discharge. However, if existing at all, this stream of material is negligibly small since prompt gettering of the water vapour takes place at latest on the rear face of the screen 5. It will be seen that the zone 7 of glow discharge extends to a considerable degree beyond the width of the screen opening 6 and at both sides thereof, the conditions illustrated being roughly to scale.

The neutral oxygen atoms 9 then cause oxidation of any metallic particles that may have been deposited on the substrate 1, so that the end result is the formation of a perfectly transparent conductive oxide layer on the substrate 1.

FIG. 2 illustrates an expedient procedure to be followed when the oxygen concentration in the atomization atmosphere is at the optimum. When oxygen is completely absent, metallic coatings are deposited on the substrate and these have a very low surface resistance $R_F$. If the oxygen content is gradually raised, then with increasing degrees of oxidation, the surface resistance rises to a maximum "MAX" and thereafter falls again, since the effect of the increasingly formed oxide (semi-conductor) then becomes measurable. This process continues until a minimum "MIN" is reached. When this condition is arrived at, the metallic shine or the dark colouration of the coating disappears, and a completely transparent coating will have been formed. If the oxygen concentration is now further raised, the surface resistance again increases. Since the object of the invention is to achieve the lowest possible surface resistance or the greatest possible conductivity accompanied by adequate transparence, it is expedient to operate in a zone which lies beyond the minimum, i.e. roughly between 6 and 10% $O_2$ in the present case. The curve shown in FIG. 2 was plotted on the basis of a total pressure of $6.5 \times 10^{-3}$ mbars, a ratio $P_{Ar}:P_{H2}$ between the argon and oxygen partial pressures of 1:2, as well as at the speed of travel v of the web of 8 m/min.

The curves seen in FIG. 3 were likewise plotted for a total pressure of the atomization atmosphere of $6.5 \times 10^{-3}$ mbars. First, a ratio $P_{Ar}:P_{H2}$, between the partial pressures, of 1:1 was used. The speed of travel v of the web was gradually increased from zero. The total pressure $P_{tot}$ of the atomization atmosphere could be maintained for a speed of travel v of the web of up to 2 m/min. Further increase in the speed of travel of the web resulted in a rise in the total pressure $P_{tot}$, as shown by the broken-line curve. The atomization rate dropped correspondingly rapidly, so that the coating process had moved into an uneconomical range. With a further rise in the increase in pressure, it would have been expected that the glow discharge would be quenched. The curve shows that, with the other stated parameters, the relatively low hydrogen concentration can be used only up to a speed of travel of the web that lay between 2 and 3 m/min. This can be explained by the fact that, with a greater speed of travel of the web, increasing amounts of water vapour find their way into the atomizing atmosphere and influence the atomization process in an unfavourable manner.

In a repetition of the test using a ratio $P_{Ar}:P_{H2}$, between the partial pressure of the argon and the partial pressure of hydrogen, of 1:2, it was found that the speed of travel v of the web could be increased to beyond 10 m/min without the total pressure $P_{tot}$—as observed with a lower hydrogen concentration—undergoing an increase. This behaviour of the glow discharge indicates a trend whereby, with a further increase in the speed of travel of the web and in the case of a sudden rise in the total pressure $P_{tot}$, that is then observed, the hydrogen content of the atomization atmosphere must be increased to give, for example, a value of 1:3 for the ratio $P_{Ar}:P_{H2}$.

Such increase in the hydrogen content can be readily accepted despite the presence of oxygen, since explosion of oxyhydrogen gas cannot occur in a vacuum, i.e. at the usual atomization pressures.

EXAMPLE:

A 1 m-wide roll comprising 3000 m of medium-quality paper for use on typewriters was placed in a cathodic atomization installation of an existing design for the coating of webs having a width of up to one meter. The installation had a volume of 3.0 $m^3$. Between the roll for supplying the paper and a roll for receiving the coated paper web, the 1 m-wide paper was fed in the horizontal direction on a portion of a horizontal conveying means below which, at a distance of 6 cm, was located an arrangement of four water-cooled cathodes each having a surface area of 75 cm × 9 cm. The cathode surfaces were provided with targets having congruent dimensions and a thickness of 8 mm. The targets consisted of a mixture of tin oxide and indium oxide with 10 mole percent of tine oxide, the remainder being indium oxide; the targets were obtained by hot-pressing extremely fine-grained powders, using a degree of pressing of 85%. The longitudinal axes of the targets were arranged in the same direction as that in which the web travelled, so that four coated stripes were created on the paper, these extending in the direction of travel of the web.

Prior to the drying operation, the paper had an initial moisture content of 15% and it emerged from the drying operation with a residual moisture content of approximately 5%. It was moved through the coating zone at a speed of 10 m/min. The atomization voltage was 320 volts, and the power supplied to the targets was 5 watts/$cm^2$. The atomization atmosphere consisted of 7.7% oxygen, 61.5% hydrogen and 30.8% argon (all percent by volume). The total pressure of the atomization atmosphere was $6.5 \times 10^{-3}$ mbars.

The coated stripes on the paper web were transparent and had a surface resistance of approximately 30 kilo ohms. The coating process lasted approximately five hours and could be maintained over the entire travelling time of the web, with constant method parameters. The properties of the coating were practically identical at the beginning and at the end; the thickness of the coating was approximately 15 nm.

We claim:

1. A method of producing electrically-conductive, transparent oxide coatings on a water-containing substrate by magnetic-field reinforced cathodic atomization thereonto of a targer hot-pressed from powdered oxide ceramic material selected from the group consisting of indium oxide/tin oxide mixtures, cadmium oxide/tin oxide mixtures and tin oxide, comprising:
   (a) atomizing the target with a direct-current voltage of between 150 and 600 volts,
   (b) adjusting the power density of the target atomization to from 3 to 15 watt/$cm^2$ of the target surface,
   (c) providing the target with a degree of pressing providing at least 75% of the density of solid material the same as the target powder, and
   (d) providing an atomization atmosphere at a pressure of from $1 \times 10^{-3}$ to $5 \times 10^{-2}$ mbars, by the controlled introduction of argon, hydrogen and oxygen in a composition which comprises from 2 to 20% of oxygen, 40 to 70% of hydrogen and the rest argon.

2. The method of claim 1, wherein the substrate is web moving past the target, and further comprising:
   controlling the speed of movement of the web past the target to provide an atomization coating thereon of from 10 to 100 nm thickness and of from 100 to 10,000 $\mu\Omega$ cm resistance.

3. The method according to claim 2, wherein providing the atomization atmosphere comprises providing the oxygen in a concentration just sufficient to prevent visible deposition of metal.

4. The method according to claim 2, wherein providing the atomization atmosphere comprises providing the hydrogen in a concentration sufficient relative to the rate of travel of the web that an increase in the pressure of the atomization atmosphere by the release of water vapor from the substrate under the affect of the atomization is prevented.

5. The method of claim 2 wherein the atomization of the target onto the substrate defines a coating zone, and further comprising providing a plate-like screen (5) between the web (1) and the target (3) having an opening (6) which is appreciably smaller than the extent of the coating zone (7) in directions parallel with the surface (4) of the target.

* * * * *